United States Patent [19]

Svendsen

[11] 4,445,215
[45] Apr. 24, 1984

[54] PROGRAMMABLE FREQUENCY RATIO SYNCHRONOUS PARALLEL-TO-SERIAL DATA CONVERTER

[75] Inventor: Gordon D. Svendsen, Belmont, Calif.

[73] Assignee: Ampex Corporation, Redwood City, Calif.

[21] Appl. No.: 355,283

[22] Filed: Mar. 5, 1982

[51] Int. Cl.³ .............................................. H04J 3/06
[52] U.S. Cl. .................................... 370/100; 370/112
[58] Field of Search ............... 370/100, 112; 328/104, 328/34

[56] References Cited

U.S. PATENT DOCUMENTS

| 3,952,298 | 4/1976 | Winkelmann et al. | 370/112 |
| 3,995,119 | 11/1976 | Pachynski | 370/112 |
| 4,027,301 | 5/1977 | Mayer | 370/112 |
| 4,300,232 | 11/1981 | Kato | 370/112 |

Primary Examiner—Douglas W. Olms
Attorney, Agent, or Firm—Elizabeth E. Strnad; Joel D. Talcott

[57] ABSTRACT

A parallel-to-serial converter for synchronously converting parallel data transferred by one or more parallel data channels into corresponding serial data streams having respectively programmable frequency ratios of the serial output data bits.

11 Claims, 3 Drawing Figures

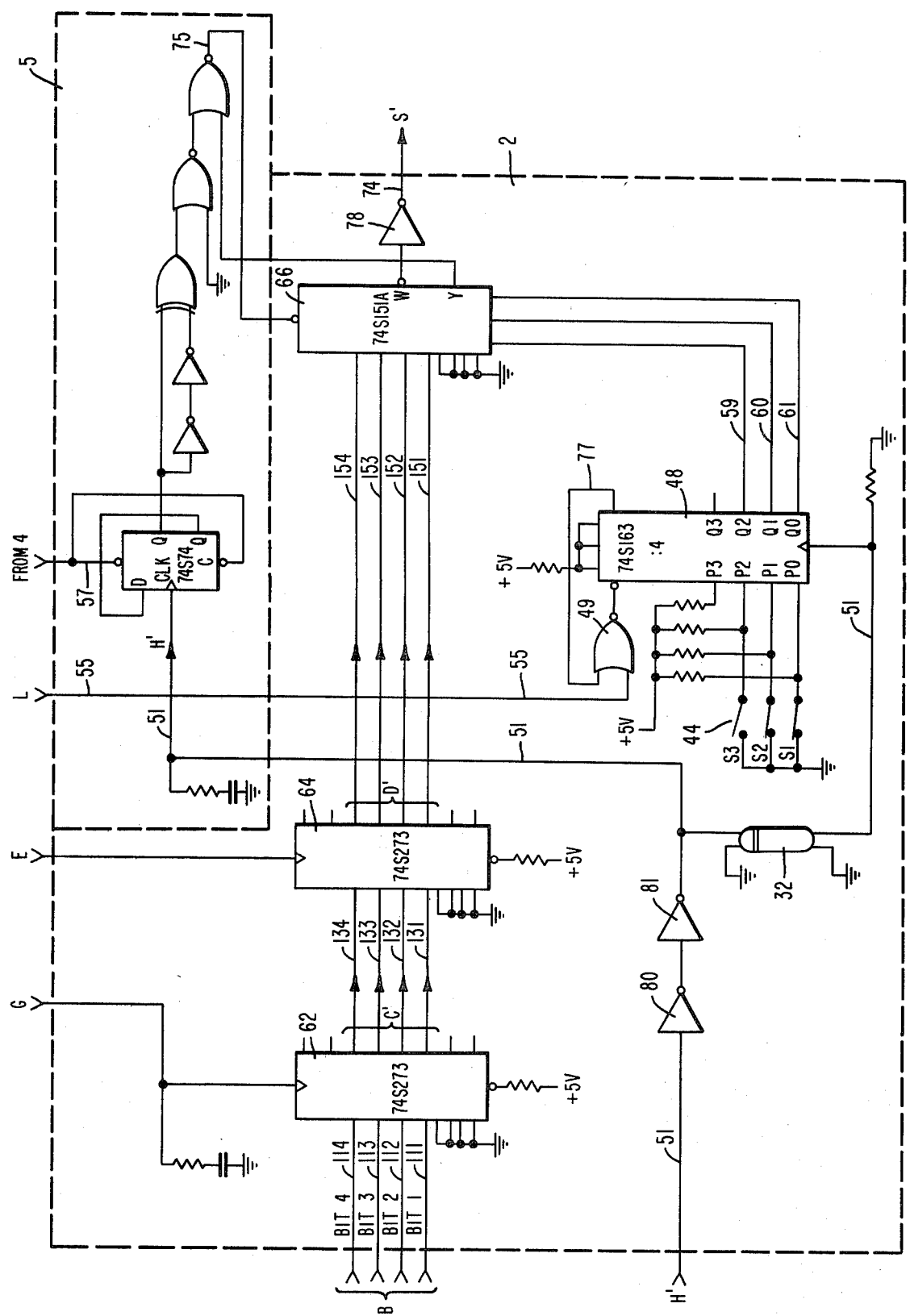
FIG_1B

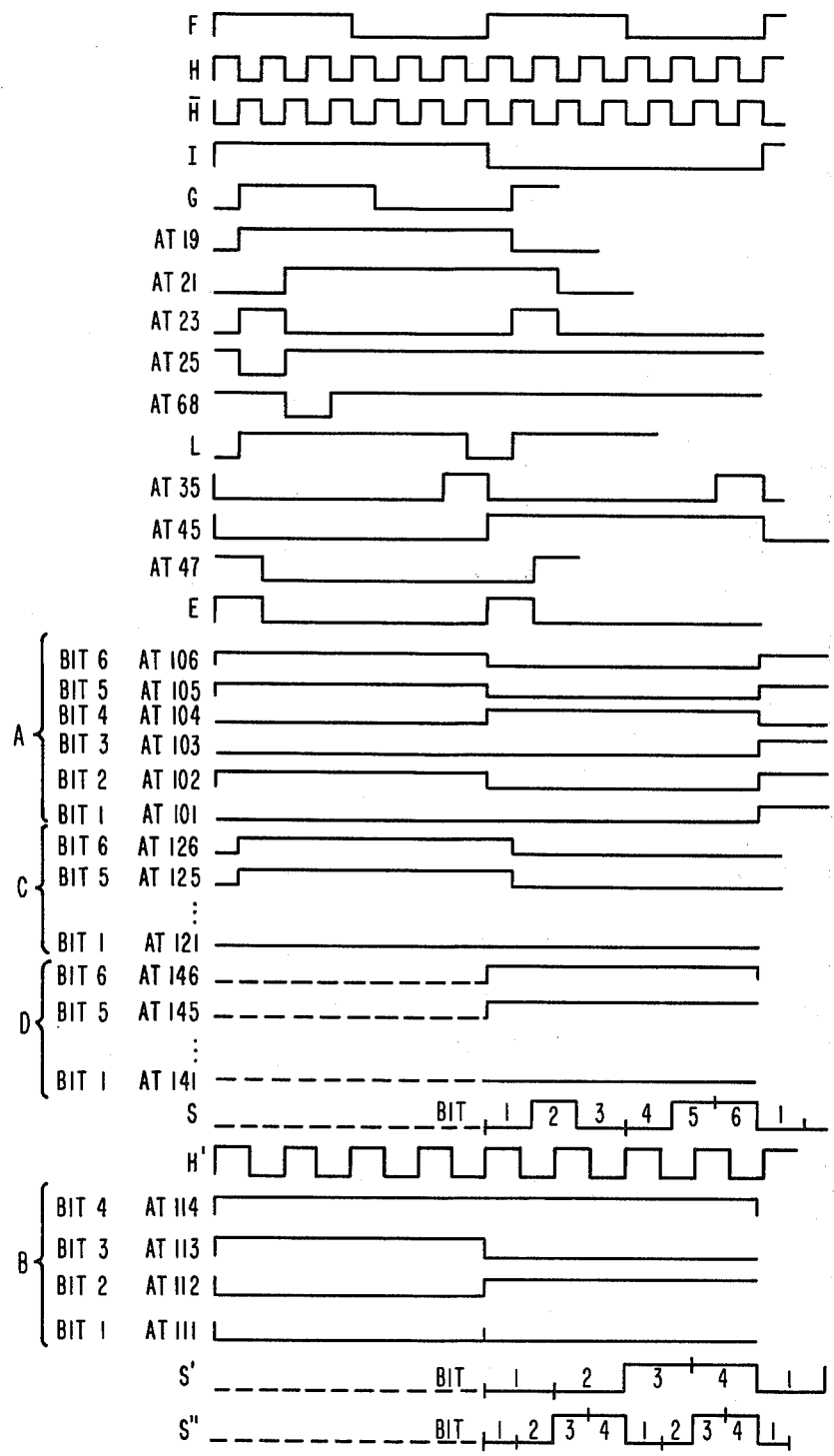
FIG_2

PROGRAMMABLE FREQUENCY RATIO SYNCHRONOUS PARALLEL-TO-SERIAL DATA CONVERTER

BACKGROUND OF THE INVENTION

The invention relates to a circuit for synchronously converting parallel data transferred by one or more parallel data channels into corresponding serial data streams having respectively programmable frequency ratios of the serial output data bits.

Prior art parallel-to-serial converters are known to utilize relatively complex circuitry to obtain synchronization. Besides, the prior art converters are inflexible when the number of the parallel input bits is to be changed and it is often necessary to redesign these circuits to accommodate such change.

SUMMARY OF THE INVENTION

Accordingly, it is an object of the present invention to provide a parallel-to-serial data converter of a relatively simple design having one or more synchronously operating data conversion channels each converting a selected number of parallel input data bits into a corresponding serial data stream having a presettable frequency ratio of the serial output data bits.

It is another object of the invention to provide a synchronous parallel-to-serial data converter which is readily adjustable to a change of serial output bit frequency in any channel.

BRIEF DESCRIPTION OF THE DRAWINGS

FIG. 2 is a timing diagram illustrating operation of the circuit of FIGS. 1A and 1B.

DETAILED DESCRIPTION

Figure 1A:
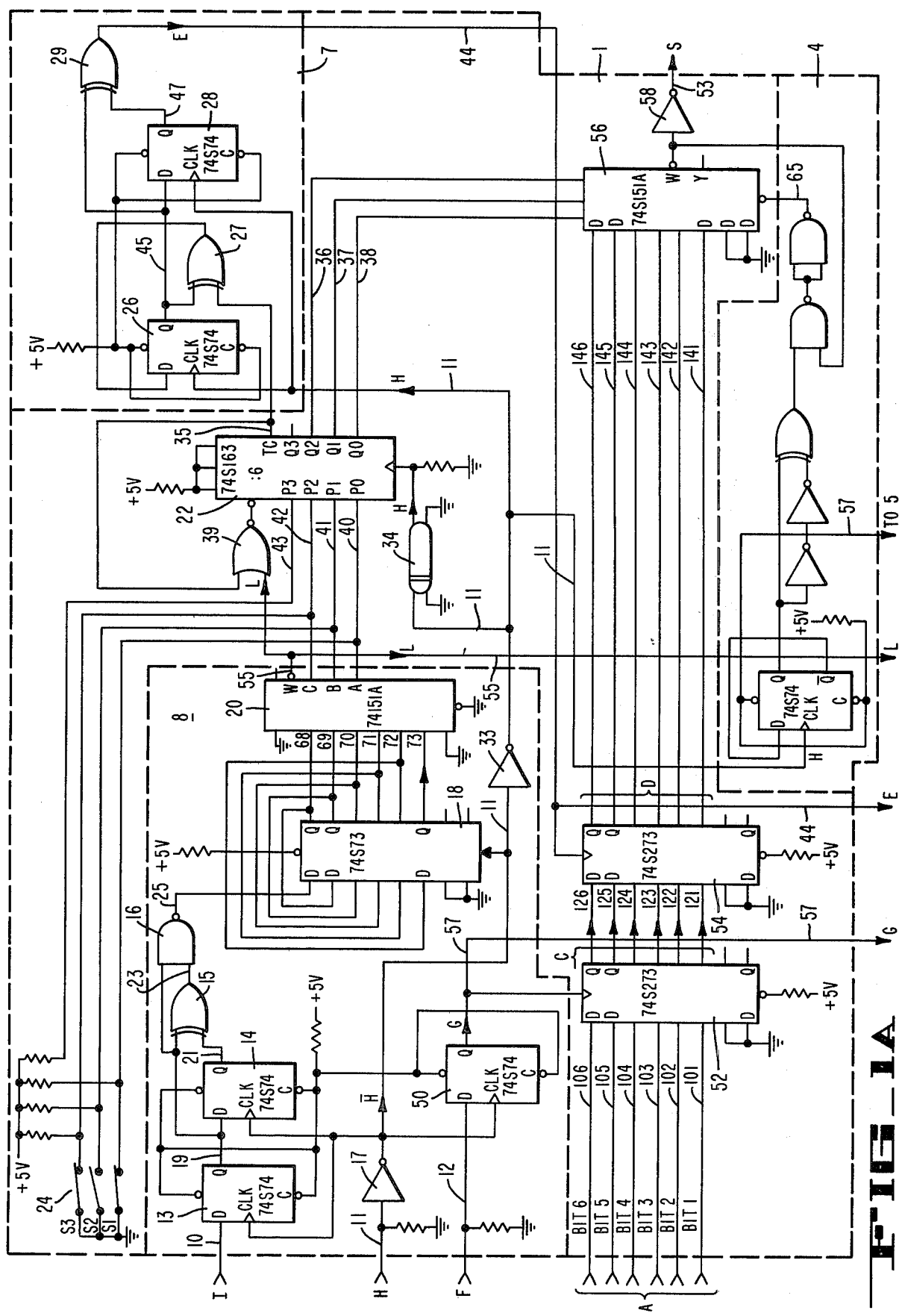
FIGS. 1A amd 1B are consecutive portions of a schematic circuit diagram of the preferred embodiment of the invention.

In accordance with the preferred embodiment of the invention there is provided a circuit for synchronously converting parallel data transferred by one or more parallel data channels into corresponding serial data streams having presettable frequency ratios between the respectively provided serial data bits. Each channel of the converter receives synchronously a known number of parallel input bits. Each received parallel bit is in the form of a digital pulse having a duration corresponding to one cycle of a parallel clock signal synchronously received therewith. The circuit also receives a word synchronizing signal (thereafter word sync) and one or more serial clock signals synchronous therewith, each having a known integral number multiple frequency with respect to the parallel clock signal. Various control signals are derived from the respective synchronizing signals by the circuit to synchronously control the bit transfer through all the parallel channels. Separate parallel-to-serial data encoders are provided for each channel which encoders are controlled synchronously by the respective control signals having programmable frequency ratios to obtain respective serial output data streams having desired frequency ratios. The control signals are synchronously derived from the clock signals to control the frequency and sequence at which the respective parallel input bits are encoded into the serial output stream. The resulting respective serial output data streams of all the channels are synchronous with each-other and also with the parallel data bits received at the inputs of the respective parallel-to-serial encoders.

In the following description terms such as signal, digital data, bit, pulse, etc. will be used interchangeably with respect to the digital character of the signals processed by the circuit of the preferred embodiment of the invention.

The invention will be now described with reference to the preferred embodiment shown in FIGS. 1A and 1B and related timing diagram of FIG. 2. To facilitate the description, FIGS. 1A and 1B have been divided into the following circuit portions, each respectively enclosed by interrupted lines: a first and a second parallel-to-serial data conversion channel 1 and 2, a first and second inhibit circuit 4 and 5, and first and second synchronization circuit 7 and 8. Each channel 1, 2 receives simultaneously a known number of parallel input bits of a predetermined duration. In the preferred embodiment channel 1 receives 6 parallel bits, thereafter designated for simplicity as parallel input word A, on lines 101 to 106 while channel 2 receives four parallel bits, thereafter designated as parallel input word B, on lines 111 to 114. Synchronously with parallel input words A and B there are received the following synchronizing signals: a parallel clock signal (thereafter parallel clock) F on line 12, serial clock signals (thereafter serial clock) H on line 11 and $H^1$ on line 51, respectively and a word synchronizing signal (thereafter word sync) I on line 10, the latter signal being received at selected intervals, for example once in 1024 parallel clocks. The respective synchronizing signals I, H, $H^1$ and F are obtained from an outside source. Preferably, the latter signals may be provided by a synchronous clock signal generator as described in a U.S. Patent Application entitled Programmable Multiple Frequency Ratio Synchronous Clock Signal Generator Circuit And Method, commonly assigned to Ampex Corporation and filed concurrently with this application. The frequency and phase relationship of the above-indicated signals to each-other and to the parallel data bits is best shown in FIG. 2. Each serial clock H, $H^1$ has a respective integral multiple frequency with respect to the parallel clock F frequency and is applied to control the frequency of the serial output data of a particular channel as it will follow from further description. The frequency $f_H$ and $f_{H1}$ of the respective serial clock signals H and $H^1$ is obtained by multiplying the parallel clock frequency $f_F$ by a selected integral number N=1, 2, 3, 4, etc. Thus the frequency relationship between the above-indicated signals may be expressed as $f_H = Nf_F$ and it may be obtained from a synchronous clock signal generator such as described in the above-indicated copending patent application.

As it is seen from the timing diagram of FIG. 2 in the preferred embodiment the duration, that is the length of each pulse representing a parallel data bit received on lines 101 to 106 and 111 to 114 corresponds to one cycle of the parallel clock F which in turn is subdivided into 6 cycles of serial clock H and into 4 cycles of serial clock $H^1$. The first synchronization circuit 7 receives serial clock H on line 11 and it derives therefrom a synchronizing control signal E in a manner which will be described later in more detail.

The parallel clock F is received on line 12 and serial clock H is received on line 11 by the second synchronization circuit 8. Signal F is applied to an input of a D flip-flop 50 which receives inverted signal H at its clock input. Flip-flop 50 provides a control signal G on line 57 utilized to synchronize loading of the respective parallel data words A, B of channels 1, 2 from the inputs 101 to 106 and 111 to 114 of respective first D flip-flop arrays 52, 62 to their respective outputs. The signal on outputs 121 to 126 of array 52 is designated C, while the signal on outputs 131 to 134 of array 62 is designated $C^1$. A programmable frequency divider 22 of channel 1 which receives serial clock H applies a terminal count obtained at its output 35 to the first synchronization circuit 7 which in turn derives therefrom a control signal E as it will be described later in more detail. Signal E obtained on line 44 from circuit 7 is applied to control respective second D flip-flop array 54 of channel 1 and 64 of channel 2 to synchronize the parallel data transfer through these channels. Thus the parallel input word A received on lines 101 to 106 of channel 1 and the parallel input word B received on lines 111 to 114 of channel 2 are transferred through the respective parallel channels in a similar manner and synchronously with each-other, since common control signals G, E are utilized to control the respective data transfers, as it will also follow from further description. Consequently the parallel word D is obtained from flip-flop array 54 on lines 141 to 146 of channel 1 simultaneously with word $D^1$ obtained from flip-flop array 64 on lines 151 to 154 of channel 2, and thus these words occur simultaneously at the inputs of respective parallel-to-serial encoders 56 and 66. To obtain desired respective serial output signal frequencies from channels 1 and 2, separate programmable frequency dividers 22 and 48 are utilized for each channel. Divider 22 receives the serial clock H on line 11 and divider 48 receives the serial clock $H^1$ on line 51 as respective clock signals. The desired division ratio of each divider 22, 48 is preset by respective programmable switches 24, 44. In the preferred embodiment divider 22 is set to divide by 6 and divider 48 is set to divide by 4 to obtain a desired frequency of the serial output data bits from channel 1 and 2, respectively. It is seen that in the preferred embodiment the above-indicated respective division ratios of each channel correspond to the number of parallel bits contained in each parallel word A, B received by that particular channel. The frequency of the serial output bits from encoders 56, 66 is controlled by providing respective binary coded control signals on lines 36 to 38 from divider 22 and on lines 59 to 61 from divider 48. The latter signals respectively control the frequency and also the sequence at which the parallel data on lines 141 and 146 and on lines 151 to 154 is encoded into serial output data S, $S^1$ on lines 53 and 74 by the respective parallel-to-serial encoders 56 and 66 of the respective channels 1, 2.

The previously mentioned inhibit circuit 4 coupled to channel 1 and circuit 5 coupled to channel 2 serve to prevent these respective channels from providing erroneous serial output data. To that effect each inhibit circuit 4, 5 receives on lines 11, 51 a respective serial clock signal H, $H^1$ and provides on lines 65, 75 a respective inhibit pulse (not shown) of a narrow width synchronous with the leading edge of the respective serial clock signal H, $H^1$. Each inhibit pulse is applied via lines 65, 75 to an inhibit input of a respective parallel-to-serial encoder 56, 66 and it interrupts the operation thereof during that pulse. Thus the encoders 56, 66 are prevented from providing an output signal during that short period of time, which in the preferred embodiment is selected 15 nanoseconds, in case there is a slight difference between the timing of the otherwise synchronous control signal received by encoder 56 on lines 36 to 38 and parallel bits D on lines 141 to 146, as well as between the control signal received by encoder 66 on lines 59 to 61 and parallel bits $D^1$ on lines 151 to 154.

To assure complete synchronization between all the channels, the previously mentioned word sync pulse I is received periodically on line 10 by the synchronization circuit 8. Circuit 8 in turn provides a synchronizing signal L on line 55 derived from the word sync pulse I and serial clock H, respectively as it will be described in more detail below. Signal L is applied to periodically preset and thus synchronize the respective programmable ratio frequency dividers 22, 48 of the respective channels 1, 2 in a manner which will be described in more detail below.

It is seen from the foregoing description that the parallel-to-serial converter of the present invention may have a desired number of synchronous parallel data conversion channels while the preset frequency ratio of the serial output data is maintained between the respective channels. While the serial output data is obtained synchronously from the various channels it is also synchronous with the parallel data transfer through the respective channels.

It will become apparent from the foregoing description that any additional channels utilized for additional parallel-to-serial data conversion will be similar to the above-described channels 1 and 2 and will operate in synchronism therewith, utilizing the above-described common control signals G, E and L provided by the synchronization circuits 7, 8. It is also apparent that other frequency ratios may be provided between the serial output data of the respective channels by utilizing different serial clock frequencies obtained by dividing the parallel clock F cycle into any convenient integral number of cycles corresponding to the number of parallel bits received by that channel or to an integral multiple of that number. These respective serial clock signals are utilized to derive the serial bit frequency of each channel. While in the above-described preferred embodiment the frequency ratio between the serial output data bits of channels 1 and 2 is 6:4, other examples of obtainable frequency ratios are 4:3, 3:2, 2:1, etc.

Depending on the particular application, the parallel-to-serial converter of the present invention may be utilized also as having only one transmission channel, such as channel 1 or channel 2 of FIG. 1.

A more detailed description of the synchronization circuits 7 and 8 follows with reference to the schematic circuit diagram of FIGS. 1A and 1B and to the timing diagram of FIG. 2. Clock signal $\overline{H}$ received on line 11 is inverted by inverter 17 and the inverted clock signal H is applied to the clock inputs of the respective D flip-flops 13 and 14 and D flip-flop array 18 respectively. Circuit 8 also receives the word synchronizing pulse I on line 10 coupled to an input of D flip-flop 13. The length of the word sync pulse I in the preferred embodiment is equal to one cycle of the parallel clock F. Flip-flop 13 delays pulse I by ½ cycle of the serial clock signal H. The delayed pulse I at output 19 of flip-flop 13 is applied to a second flip-flop 14 which delays it further by one cycle of signal H. The output signal on line 21 from flip-flop 14 is applied to exclusive OR gate 15 which provides at its output 23 two subsequent pulses each having a width corresponding to the phase difference between the respective pulses on lines 19 and 21. A negative AND gate 16 which has one input coupled to line 19 and its second input to line 23 provides an output signal on line 25 which corresponds to the first occurring pulse on line 23, while the second occurring pulse is removed. The signal on line 25 is applied to input of a first flip-flop of an array of D flip-flops 18 which are connected together to provide a shift register as follows. The first flip-flop of the array 18 has its output 68 connected to the input of the second flip-flop which in turn has its output 69 connected to the input of a third flip-flop of the array 18, and so on, all outputs 68 to 73 of flip-flop array 18 being connected to respective inputs of a selector switch 20. Consequently the signal on line 25 is stepped through the flip-flop array 18 in such a way that it appears at subsequent outputs 68 to 72 thereof at subsequent clock cycles of signal $\overline{H}$. Selector switch 20 is preset by programmable switches 24 via lines 40 to 42 to select as its output signal on line 55 the output signal on line 72 from shift register 18. Selector switch 20 may be programmed by switches 24 to apply to its output line 55 any of its input signals on lines 68 to 72, each corresponding to a 1 to 6 serial clock cycle delay provided by shift register 18. In the preferred embodiment the contacts S1 to S3 of the programmable switches 24 are set to obtain a control signal on lines 40 to 42 which sets a desired frequency ratio of divider 22 and it selects a corresponding delay of the pulse on line 25 provided by a respective output of shift register 18 via selector switch 20. Programmable switches 24 may be set to provide respective combinations of high and low output signals therefrom on lines 40 to 42 as it is depicted in Table 1 below:

TABLE 1

| Divider 22, 48 set to divide by | S1 | S2 | S3 | Output signal from switch selector 20 applied to 55 from line: |
|---|---|---|---|---|
| 2 | LO | HI | HI | 68 |
| 3 | HI | LO | HI | 69 |
| 4 | LO | LO | HI | 70 |
| 5 | HI | HI | LO | 71 |
| 6 | LO | HI | LO | 72 |

Thus in the preferred embodiment the divider 22 is set by the signal on lines 40 to 42 to divide by 6 and the selector switch 20 is controlled by the latter signal to apply the delayed pulse on line 72 from shift register 18 to its output 55. As it is seen from FIG. 2 the resulting pulse L on line 55 is delayed to have its middle coincident with the beginning of a parallel clock F cycle.

It will be understood that the above-indicated combinations of contact positions of switch 24 may be further extended to obtain higher division ratios and related extended delay of the signal on line 55, corresponding to the signal on line 25.

It is noted herein that analogously with switches 24 of channel 1 the respective positions of contacts S1 to S3 indicated in TAB. 1 also apply to switches 44 of channel 2 with respect to setting frequency divider 48 to obtain a desired frequency ratio thereof.

The programmable frequency divider 22 is implemented in the preferred embodiment by a free running counter which is set by programmable switches 24 via lines 40 to 43 to divide by 6. Counter 22 is periodically reset by its terminal count obtained on line 35 and it is periodically preset by the control signal L on line 55 via a negative OR gate 39. The signal on line 35 is non-symmetrical as it is seen from FIG. 2. The latter signal is applied to an input of the synchronization circuit 7 and more particularly, to a frequency divider by 2 implemented by a D flip-flop 26 connected to an exclusive OR gate 27 in a manner well known in the art. The resulting symmetrical signal from the divider by 2 on line 45 is further applied to a D flip-flop 28 where it is delayed by one cycle of serial clock H and the thusly delayed signal on line 47 is applied to one input of an exclusive OR gate 29. The other input of exclusive OR gate 29 receives the signal on line 45 and the resulting output signal E on line 44 from gate 29 corresponds to the previously described control signal E which is applied to D flip-flop arrays 54, 64 to synchronize the parallel data transfer through the respective channels 1 and 2 of the circuit of FIGS. 1A and 1B. As it is seen from FIG. 2 signal E has a pulse width corresponding to one cycle of the serial clock signal H and a frequency corresponding to that of the parallel clock F.

Consequently, the parallel data bits C stored on lines 121 to 126 of the flip-flop array 54 and $C^1$ stored on lines 131 to 134 of array 64 are sampled simultaneously by the positively going edge of control signal E once during the parallel clock F cycle. The resulting sampled signal corresponds to parallel bits D which occur on input lines 141 to 146 of parallel-to-serial encoder 56 simultaneously with bits $D^1$ on lines 151 to 154 at the input of encoder 66.

Since the programmable frequency dividers 22, 48 implemented in the preferred embodiment by free running counters reset at each terminal count, the control signal E on line 44 and the respective binary coded control signals on lines 36 to 38 from divider 22 and on lines 59 to 61 from divider 48 are recurring. However, every time upon receipt of the word sync pulse I on line 10 the synchronizing signal L on line 55 is provided and it presets the above indicated dividers 22, 48 to assure synchronization of the operation on all parallel channels, as it has been described previously.

Alternatively, instead of supplying a word sync I at selected intervals, it is possible to connect the input lines 10 and 12 and thus apply the parallel clock F also on line 10. In the latter case the above-described operation of the synchronization circuit 8 will remain the same, however, the synchronization signal L on line 55 will be provided at the parallel clock F frequency and consequently the circuit will more frequently receive synchronizing pulses.

Now the operation of the parallel-to-serial encoder 56 of channel 1 and 66 of channel 2 will be described in more detail. As it has been described previously the frequency divider 22 receives at its clock input the serial clock H, while the frequency divider 48 receives as its clock signal the serial clock $H^1$. The divider 22 is preset by programmable switches 24 via lines 40 to 42 to divide by 6, as described previously. Consequently, the frequency of the binary coded output signal on control lines 36 to 38 from divider 22 is determined by the serial clock H frequency, while the signal itself represents a recurring binary count changing from 1 to 6. The encoder 56 of channel 1, which is preferably implemented by a selector switch, receives that changing count at its control input and responsively applies the parallel bits D received on input lines 141 to 146 to its output 53 sequentially as serial output bits 1 to 6 in a sequence and at a frequency determined by the control signal on lines 36 to 38 that is, by the serial clock H frequency. The serial output signal on line 53 is inverted by inverter 58 and the output signal S therefrom is shown in FIG. 2.

The frequency divider 48 is preset by programmable switches 44 to divide by 4. The frequency of the binary coded output signal on lines 59 to 61 from divider 48 is determined by the frequency of the serial clock $H^1$. The latter signal represents a recurrent binary count which changes from 1 to 4. The encoder 66 of channel 2, is similar to the encoder 56 of channel 1. It receives the changing count via control lines 59 to 61 synchronously with the count received by encoder 56 on lines 36 to 38. Consequently, both encoders 56, 66 provide the respective output signals S, $S^1$ on lines 53, 74 synchronously with each-other as well as with the occurrence of the parallel bits D, $D^1$ on lines 141 to 146 and 151 to 154, respectively, as it is also partially shown in FIG. 2. Inverters 80, 81 on line 51 are utilized to delay serial clock $H^1$ by a time equal to the delay provided by inverters 17, 33 in the serial clock H path on line 11 to maintain synchronization of these respective clock signals H, $H^1$. Since the respective serial output bits obtained from encoders 56, 66 are in the form of inverted data, they are respectively re-inverted by inverters 58, 78 and the resulting re-inverted data S, $S^1$ is shown in FIG. 2.

The respective components implementing the elements 52, 62, 54, 64, 56, 66, of the preferred embodiment of FIGS. 1A and 1B can be utilized for up to eight parallel bits received by any channel. In applications where more than eight parallel bits are received by any of the channels, two or more of each type of the above-indicated elements may be connected in series as it may be necessary to accommodate any number of parallel bits in the excess of eight bits.

It follows from the foregoing description that the receipt of the respective parallel word B on lines 111 to 114 and its transfer via lines 131 to 134 and lines 151 to 154 of channel 2 is analogous with the receipt and transfer of parallel data word A of channel 1 and synchronous therewith. Consequently, a detailed description will not be repeated herein with respect to the operation of channel 2. However, an example of parallel data bits B received on lines 111 to 114 of channel 2 and the corresponding serial output data stream $S^1$ obtained on line 74 from that channel is shown in FIG. 2 for illustration.

In some applications where it may be desired to provide redundant serial data for error reduction or other purposes on one or more channels, the parallel-to-serial data converter may be utilized as follows. For example, if it is desired to provide such a redundant data on channel 2 of the above-described circuit of FIG. 1, it is possible to apply instead of the serial clock signal $H^1$ a serial clock signal H" (not shown) having twice the frequency of clock signal H'. Consequently, the frequency of a corresponding serial output signal s" obtained at the output 74 of encoder 66 would also correspond to that of clock signal H" while each sequence of serial output bits BIT 1 to BIT 4 would be repeated twice during each parallel clock F period, as it is shown at S" in FIG. 2. It will be understood that by multiplying the frequency of a respective serial clock signal of a particular channel by any higher integral multiple number of the number of parallel bits received by that channel, there may be obtained corresponding higher serial output bit frequencies and a related number of bit repetitions.

While preferred embodiments of the invention have been described above and illustated in the drawings, it will be appreciated that a number of alternatives and modifications may be made which will fall within the scope of the appended claims.

What is claimed is:

1. A parallel-to-serial data converter circuit for synchronously converting parallel data bits into corresponding serial databits, said circuit having one or more data conversion channels and receiving a parallel clock signal having a frequency corresponding to and synchronous with that of the parallel data bits, each channel receiving a serial clock signal having an integral number multiple frequency with respect to said parallel clock signal and synchronous therewith said integral number corresponding to a number of parallel bits received by that particular channel or to an integral multiple of said number of parallel bits, respectively, each channel respectively comprising:

a storage means coupled to receive and store said number of parallel data bits and having an output coupled to apply thereto said stored bits in response to a first control signal;

a parallel-to-serial data encoder means having an input coupled to said output of said storage means for receiving said parallel data bits therefrom and to provide synchronously therewith a corresponding serial output data stream;

a programmable frequency ratio control means coupled to receive said serial clock signal and to provide synchronously therewith a respective second control signal having a frequency corresponding to said received clock signal, said control signal being coupled to said data encoder means to control the frequency and sequence of encoding said parallel data of that respective channel into a corresponding serial data stream; and said data converter circuit further comprising a synchronization circuit which is common to all said channels and is coupled to receive one said serial clock signal and to provide synchronously therewith said first control signal coupled to a control input of each said storage means, said first control signal having a frequency corresponding to that of said parallel clock signal and synchronous therewith, said synchronization circuit being further coupled to receive a synchronizing signal having an integral frequency ratio with respect to said parallel clock signal and synchronous therewith and to provide a third control signal applied to synchronize said programmable frequency ratio control means of each said channel respectively, said third control signal having a frequency corresponding to that of said synchronizing signal received by said synchronization circuit and being synchronous therewith.

2. The circuit of claim 1 wherein said programmable frequency ratio control means of each channel comprises a presettable frequency divider means having a frequency division ratio respectively preset to correspond to said number of parallel bits received by that particular channel and wherein said second control signal provided by each said frequency divider means is a recurrently changing binary count determined by said preset division ratio thereof.

3. The circuit of claim 1 wherein a selected data conversion channel is coupled to receive a serial clock signal having a frequency equal to twice the number of parallel bits received by that channel to obtain from said parallel-to-serial data encoder means of that channel a corresponding synchronous serial output data bit stream having a frequency corresponding to that of said serial clock signal and in which the sequence of each group of serial bits corresponding to the number of received parallel bits occurs twice during each parallel clock cycle.

4. A circuit for synchronously converting parallel data received by one or more parallel data channels into corresponding serial data streams, said circuit receiving a parallel clock signal having a frequency corresponding to that of the parallel data bits and synchronous therewith, each channel receiving a serial clock signal having an integral number multiple frequency with respect to said parallel clock signal and synchronous therewith, said integral number corresponding to a number of parallel bits received by that particular channel or to an integral multiple of said number of parallel bits, respectively, each channel respectively comprising:

- a storage means having an input coupled to receive and store a said number of parallel data bits and having an output coupled to apply thereto said stored parallel bits in response to a first common control signal received by each said storage means;
- a parallel-to-serial data encoder means having an input coupled to said output of said storage means for receiving said parallel data bits therefrom and having an output coupled to apply thereto said received parallel bits in the form of a serial output bit stream having a frequency and sequence determined by a respective second control signal received by said encoder means;
- a presettable frequency divider means having an input coupled to receive said serial clock signal and being preset to have a frequency division ratio corresponding to said number of parallel data bits received by that particular channel, said frequency divider means having an output coupled to provide said second control signal as a recurrent binary count corresponding to said preset division ratio and having a frequency corresponding to said received serial clock signal;
- said data converting circuit further comprises a common synchronization circuit for all said channels having a first and a second synchronization means said first synchronization means being coupled to receive an output signal of a selected one of said presettable frequency divider means for providing said first common control signal having a frequency corresponding to the ratio preset by said frequency divider means with respect to a serial clock signal received thereby and synchronously therewith and, said first control signal being commonly applied to the respective storage means of all said channels, and said second synchronization means being coupled to receive said serial clock signal and a synchronizing signal having an integral frequency ratio with respect to said parallel clock signal and synchronous therewith, said second synchronization means being coupled to provide a third control signal having a frequency corresponding to that of said received synchronizing signal and being applied to synchronize said respective presettable frequency divider means of each said channel, respectively.

5. The circuit of claim 4 wherein said first synchronization means comprises a first delay and gating means having an input coupled to receive said output signal as a terminal count from said selected presettable frequency divider means and having a clock input coupled to receive that serial clock signal which is also received by said selected frequency divider means, said first delay and gating means being coupled to provide said first control signal as an output pulse having a length substantially corresponding to one cycle of said serial clock signal and synchronous therewith.

6. The circuit of claim 4 wherein said second synchronization circuit comprises:

- a second delay and gating means having respective inputs for receiving said synchronizing signal and said serial clock signal and having an output providing an output pulse having a length substantially corresponding to one cycle of said received serial clock signal and a frequency corresponding to that of said synchronizing signal; and
- a shift register means having an input coupled to said output of said second delay and gating means and a clock input for receiving said serial clock signal, said shift register means coupled to delay said output pulse provided by said second delay and gating means by one clock cycle at each subsequent serial clock signal to provide said third control signal as an output pulse having its middle substantially coincident with the beginning of the parallel clock cycle.

7. The circuit of claim 4 wherein said programmable ratio frequency divider means comprises a presettable binary counter means, respectively, and a means for presetting the count provided by each said counter means to obtain a desired frequency division ratio provided by said frequency divider means.

8. The circuit of claim 4 wherein said means for presetting said count are programmable switches.

9. A parallel-to-serial data converter circuit for synchronously converting parallel data bits into corresponding serial data bits, said circuit having one or more data conversion channels and receiving a parallel clock signal having a frequency corresponding to and synchronous with that of said parallel data bits, each channel receiving a serial clock signal having an integral number multiple frequency with respect to said parallel clock signal and synchronous therewith, said integral number of corresponding to a number of parallel bits received by that particular channel or to an integral number multiple of said number of parallel bits, respectively, each channel respectively comprising:

- a storage means having a number of inputs each coupled to receive one said parallel data bit and having a number of outputs corresponding to said inputs, said storage means being coupled to apply said stored parallel data bits to said outputs, respectively, in response to a first common control signal received simultaneously by said storage means of all said channels;
- a parallel-to-serial data encoder means having a number of inputs each coupled to one said output of said storage means, said encoder means having a control input coupled to receive a respective second control signal for controlling the frequency and the sequence of encoding said parallel data bits obtained by said respective inputs of said encoder means into said serial data bits respectively provided by an output of said encoder means of each said channel;
- a presettable frequency divider means having an input coupled to receive said serial clock signal and whose division ratio is set to correspond to the number of parallel bits received by that particular channel, said divider means being coupled to provide said second control signal as a recurring binary count equal to said set division ratio and having a frequency corresponding to said serial clock signal received by the divider means;

said data converter circuit further comprising a first and a second synchronization means common to all said channels;

said first synchronization means having an input coupled to receive a terminal count from a selected one of said presettable frequency divider means and having an output coupled to provide said first synchronization signal having a frequency corresponding to that of said terminal count; and said second synchronization means having a first input coupled to receive said serial clock signal received by said selected presettable frequency divider means and having a second input coupled to receive a synchronizing signal having an integral frequency ratio with respect to said parallel clock signal and synchronous therewith, said second synchronization means being coupled to provide a third control signal having a frequency corresponding to that of said received synchronizing signal, synchronous therewith and being applied to synchronize said presettable frequency divider means of each channel, respectively.

10. The circuit of claim 9 wherein said second synchronization means comprises a delay and gating means having respective inputs for receiving said synchronizing signal and said serial clock signal and having an output providing an output pulse having a length substantially corresponding to one cycle of said received serial clock signal and a frequency corresponding to that of said synchronizing signal; and a shift register means having an input coupled to said output of said delay and gating means and a clock input for receiving said serial clock signal, said shift register means coupled to delay said output pulse provided by said first delay and gating means by a number of serial clock cycles which number corresponds to the frequency ratio preset by said selected presettable divider means, to provide said third control signal as a pulse having its middle substantially coincident with the beginning of the parallel clock cycle.

11. The circuit of claim 10 further comprising a programmable switch means programmed to provide an output signal corresponding to a selected binary count and coupled to said selected presettable frequency divider means to preset a desired frequency ratio thereof, said output of said switch means being also coupled to said shift register means for selecting an output signal therefrom having a delay equal to a number of said serial clock cycles corresponding to said preset ratio.

* * * * *

UNITED STATES PATENT AND TRADEMARK OFFICE
CERTIFICATE OF CORRECTION

PATENT NO. : 4,445,215
DATED : April 24, 1984
INVENTOR(S) : Gordon D. Svendsen

It is certified that error appears in the above-identified patent and that said Letters Patent are hereby corrected as shown below:

Column 1, line 32, "amd" should read --and--;

Column 4, line 52, "$\overline{H}$" should read --H--;

Column 4, line 53, "H" should read --$\overline{H}$--;

Signed and Sealed this

Thirteenth Day of August 1985

[SEAL]

Attest:

DONALD J. QUIGG

Attesting Officer *Acting Commissioner of Patents and Trademarks*